United States Patent
Sjöland et al.

(10) Patent No.: US 10,541,737 B2
(45) Date of Patent: Jan. 21, 2020

(54) PHASE LOCKED LOOP, PHASE LOCKED LOOP ARRANGEMENT, TRANSMITTER AND RECEIVER AND METHOD FOR PROVIDING AN OSCILLATOR SIGNAL

(71) Applicant: Telefonaktiebolaget LM Ericsson (publ), Stockholm (SE)

(72) Inventors: Henrik Sjöland, Lund (SE); Tony Påhlsson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/061,467

(22) PCT Filed: Dec. 22, 2015

(86) PCT No.: PCT/EP2015/081007
§ 371 (c)(1),
(2) Date: Jun. 12, 2018

(87) PCT Pub. No.: WO2017/108100
PCT Pub. Date: Jun. 29, 2017

(65) Prior Publication Data
US 2019/0260443 A1    Aug. 22, 2019

(51) Int. Cl.
*H04B 7/06* (2006.01)
*H03L 7/099* (2006.01)
(Continued)

(52) U.S. Cl.
CPC .......... *H04B 7/0617* (2013.01); *H03L 7/087* (2013.01); *H03L 7/0896* (2013.01); *H03L 7/097* (2013.01);
(Continued)

(58) Field of Classification Search
CPC .......... H04B 7/0617; H04B 1/04; H04B 1/16; H03L 7/087; H03L 7/0896; H03L 7/097; H03L 7/099; H04L 27/152
See application file for complete search history.

(56) References Cited

U.S. PATENT DOCUMENTS 6,147,561 A * 11/2000 Rhee ................ H03L 7/087
                                                  331/12
7,492,850 B2   2/2009 Menolfi et al.
(Continued)

FOREIGN PATENT DOCUMENTS

EP   1184988 A2   3/2002
EP   2843839 A1   3/2015
(Continued)

OTHER PUBLICATIONS

Miyashita, D. et al., "A-104dBc/Hz in-Band Phase Noise 3GHz All Digital PPL with a Phase Interpolation Based Hierarchical Time to Digital Convertor", 2011 Symposium on VLSI Circuits Digest of Technical Papers, Jun. 15, 2011, pp. 112-113, IEEE.
(Continued)

*Primary Examiner* — Freshteh N Aghdam
(74) *Attorney, Agent, or Firm* — Coats & Bennett, PLLC

(57) ABSTRACT

A phase locked loop, particularly for or in a beamforming system comprises a loop filter (1) to provide a control signal (FC) to a controllable oscillator (2); a frequency divider (3) configured to provide a first feedback signal (FB) and a second feedback signal (FBD) in response to an oscillator signal (FO), the second feedback signal (FBD) delayed with respect to the first feedback signal (FB); a first comparator path (4) configured to receive the first feedback signal (FB) and a second comparator path (5) configured to receive the second feedback signal (FBD), each of the first and second comparator path (4, 5) configured to provide a respective current signal (CS1, CS2) to the loop filter (1) in response
(Continued)

to a respective adjustment signal (FA1, FA2) and a phase deviation between a common reference signal (FR) and the respective feedback signal (FB, FBD).

24 Claims, 6 Drawing Sheets

(51) Int. Cl.
    *H03L 7/097*     (2006.01)
    *H04L 27/152*     (2006.01)
    *H03L 7/087*     (2006.01)
    *H04B 1/04*     (2006.01)
    *H04B 1/16*     (2006.01)
    *H03L 7/089*     (2006.01)

(52) U.S. Cl.
    CPC .............. *H03L 7/099* (2013.01); *H04B 1/04* (2013.01); *H04B 1/16* (2013.01); *H04L 27/152* (2013.01)

(56) References Cited

U.S. PATENT DOCUMENTS

| | | | |
|---|---|---|---|
| 9,048,843 B1 | 6/2015 | Nordyke | |
| 10,003,346 B2 | 6/2018 | Sjoland et al. | |
| 2007/0071156 A1* | 3/2007 | Gregorius | H03L 7/087 375/376 |
| 2008/0265999 A1 | 10/2008 | Wan et al. | |
| 2011/0032040 A1* | 2/2011 | Beghini | H03C 3/0941 331/2 |
| 2015/0295583 A1* | 10/2015 | Tang | H03L 7/099 331/48 |
| 2018/0138917 A1* | 5/2018 | Pahlsson | H03L 7/0898 |

FOREIGN PATENT DOCUMENTS

| | | |
|---|---|---|
| WO | 2015172372 A1 | 11/2015 |
| WO | 2018001526 A1 | 1/2018 |

OTHER PUBLICATIONS

Buchanan, N.B., "Triple Mode PLL Antenna Array", 2004 IEEE MTT-S International Microwave Symposium Digest, Jun. 6, 2004, pp. 1691-1694, IEEE.

Shi, B. et al, "Electronic Beam Streering Using PLL Array for Radar Applications in W-band", 2015 IEEE 5th Asia-Pacific Conference on Synthetic Aperture Radar (APSAR), Sep. 1, 2015, pp. 274-276, IEEE.

Axholt, A. et al., "A 60 GHz Receiver Front-End with PLL based Phase Controlled LO Generation for Phased-Arrays", Paper V, Submitted to IEEE Proc. Asia Pacific Microwave Conference, APMC 2011, Dec. 5, 2011, pp. 1-5, IEEE.

Axholt A, et al., "A PLL based 12GHz LO Generator with Digital Phase Control in 90nm CMOS A", Analog Integrated Circuits and Signal Processing, vol. 67, issue 3, Jan. 1, 2011, pp. 309-318, Springer Reprinted.

* cited by examiner

PHASE LOCKED LOOP, PHASE LOCKED LOOP ARRANGEMENT, TRANSMITTER AND RECEIVER AND METHOD FOR PROVIDING AN OSCILLATOR SIGNAL

TECHNICAL FIELD

The present disclosure relates to a phase locked loop, particularly for a beamforming system, a phase locked loop arrangement, a transmitter and receiver arrangement and a method for providing an oscillator signal in a phase locked loop

BACKGROUND

Wireless systems typically up-convert a baseband signal to a Radio Frequency (RF) for transmission, and down-convert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals. In some cases, stringent requirements are placed on the mixing frequency signal, such as produced by a PLL.

It is foreseeable that 5G cellular systems will use millimetre waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the oscillator signal generated by the PLL. In any event, accurate phase shifts are required to provide accurate beamforming. It is also desirable to be able to program the frequency of the oscillator signal to enable the wireless device to operate on different frequency channels and in different bands.

Besides the ability to introduce a programmable phase shift and programmable frequency, the local oscillator generation circuitry shall also achieve a low phase noise and other aspects without consuming excessive power.

SUMMARY

As a result of all of these considerations, the inventors have realized that it would be beneficial to improve the generation of the oscillator signals so as to provide the desired phase shift programmability.

The solution presented herein proposes to adjust or change the phase of an oscillator signal by comparing the reference signal with different feedback signals and generate an oscillator control signal depending therefrom and from a phase adjustment signal.

According to an aspect, a phase locked loop for or in a beamforming system comprises a loop filter configured to provide a control signal to a controllable oscillator, wherein the controllable oscillator is configured to provide an oscillator signal in response to the control signal. A frequency divider is configured to provide a first feedback signal and a second feedback signal in response to the oscillator signal. The second feedback signal is delayed with respect to the first feedback signal. Further, a first comparator path is configured to receive the first feedback signal and a second comparator path is configured to receive the second feedback signal. Each of the first and second comparator paths is configured to provide a current signal to the loop filter in response to a phase deviation between a common reference signal and the respective feedback signal and a respective phase adjustment signal. Said adjustment signal may be used to control the phase of the oscillator signal.

The proposed solution offers an easier matching of the circuitry providing the current signals thus enabling improved phase control accuracy. The area used to implement the hardware may be reduced compared to previous solutions. In addition, the relation between the phase skew and the phase adjustment signals applied to the comparator paths may become substantially linear in the phase region of interest.

According to another aspect, phase locked loop arrangement for a beamforming system having at least two phase locked loops as disclosed above also comprises a reference signal source providing the reference signal. The reference signal source is coupled to the first and second comparator path of each of the at least two phase locked loops. A phase deviation module is configured to provide a phase control signal or phase control word to each of the phase locked loops to generate a phase difference between oscillator signals of the at least two phase locked loops. In this aspect, a phase difference between two or more phase locked loops in or for a beamforming system can be easily adjusted by the phase control signals applied to the phase locked loops from which the adjustment signals are derivable. In an aspect the phase locked loop utilizes the phase control signal or phase control word to generate the phase adjustment signals.

Other aspects are related to a transmitter and a receiver respectively. A transmitter comprises phase locked loop arrangement or a plurality of the phase locked loops as stated above and an antenna array having a plurality of antenna elements. Each of the antenna elements is in operative connection to a respective one of the phase locked loops to receive an individual signal for transmission derived from the respective oscillator signal thereof.

Concurrently, a receiver comprises a phase locked loop arrangement or a plurality of the phase locked loops as stated above and an antenna array having a plurality of antenna elements. Each of the antenna elements is in operative connection to a respective one of the phase locked loops of the phase locked loop arrangement to down-convert a received signal with the respective oscillator signal thereof.

Yet another aspect is related to method for providing an oscillator signal in a phase locked loop. The method comprises generating a common reference signal, generating an oscillator signal in response to a control signal, generating a first feedback signal based on the oscillator signal and a second feedback signal based on the oscillator signal. The second feedback signal is delayed with respect to the first feedback signal. The method also comprises generating a first current signal based on a comparison between the reference signal and the first feedback signal and a second current signal based on a comparison between the reference signal and the second feedback signal. A current ratio between the first and second current signals is adjusted.

Finally, the control signal is generated based on the adjusted current ratio of first and second current signals.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
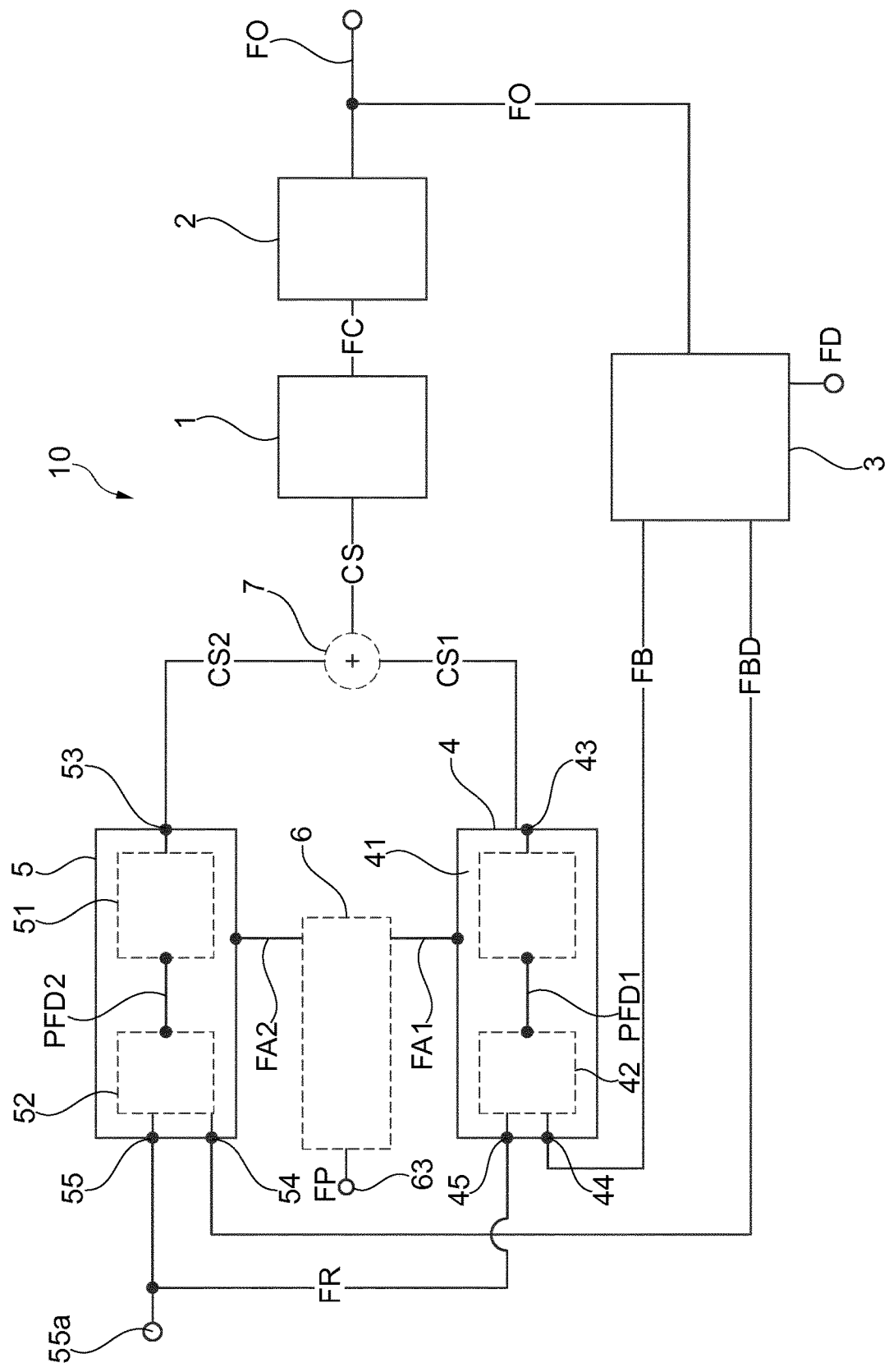
FIG. 1 illustrates an embodiment of a phase locked loop.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

It should further be noted that any reference signs do not limit the scope of the claims, that the example embodiments may be implemented at least in part by means of both hardware and software, and that several "means", "units" or "devices" may be represented by the same item of hardware.

A "wireless device" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc. Furthermore, a device may be interpreted as any number of antennas or antenna elements.

Although the description is mainly given for a user equipment, as measuring or recording unit, it should be understood by the skilled in the art that "user equipment" is a non-limiting term which means any wireless device, terminal, or node capable of receiving in DL and transmitting in UL (e.g. PDA, laptop, mobile, sensor, fixed relay, mobile relay or even a radio base station, e.g. femto base station).

It is foreseeable that the next generation of cellular systems and wireless communication will use frequencies in the higher GHz frequency range, that is above 15 GHz and up to 60 GHz. Outdoors in rural and urban areas the signal echoes will have longer delays than indoors, so longer prefixes resulting in closer subcarrier-spacing in the proposed underlying OFDM modulation is required compared to indoor only systems. Consequently, phase noise and other requirements concerning the signal quality are increased to achieve a reliable data transmission enabling high data throughput. Furthermore, the signal attenuation at these frequencies will be high in a cellular system, which can be mitigated using beamforming systems. Such beamforming systems include a large number of antenna elements in an array, being able to transmit or receive in a desired and steerable direction. To control the beam or receiving direction, a dedicated phase shift of the signal must be applied to each respective antenna element. In a key implementation it has been proposed to establish such phase shift in the local oscillator signal provided by a PLL coupled to the respective antenna element.

In these cases, each antenna element is connected to a transceiver (transmitter and/or receiver), and each transceiver receives individual local oscillator (LO) signals from a local phase-controlled phase locked loop, or short (PLL). The phase locked loop comprises a feedback path, normally including a programmable frequency divider circuit dividing the output oscillator signal by a programmable ratio and feeding the frequency-divided signal back to the phase comparator. As a result, the phase comparator using a common reference signal, e.g. a common reference signal in the low frequency range, the output signals of the PLLs will lock in different well defined phase relations. Regardless of scheme used for the frequency division, integer-N or fractional-N, there is a need to control the phase of the output signal of the different PLLs.

Some proposals suggested using digitally controlled current sources to inject current into the loop filters of each local PLL, which will produce a very accurately controlled and linear phase shift of the output signal.

A solution for generating the local oscillator signals with some control for its phase is for example illustrated in A. Axholt, H. Sjoland, "A PLL based 12 GHz LO generator with digital phase control in 90 nm CMOS", Analog Integrated Circuits and Signal Processing, Vol. 67, No. 3, pp. 309-318, 2011. Another example is shown in A. Axholt and H. Sjoland, "A 60 GHz Receiver Front-End with PLL based Phase Controlled LO Generation for Phased-Arrays", IEEE Proc. Asia Pacific Microwave Conference, APMC 2011, APMC 2011, December 2011, Melbourne, Australia. In both cases, an additional adjustable current source injects a small DC current into the loop filters of each local PLL, which will produce a phase shift of the output signal. In equilibrium, the loop becomes frequency and phase locked and will strive to return in case of deviations, so the loop reacts to the "disturbance" caused by the injected current by a proportional phase-skew between the reference signal and the feedback signal at the input of the phase detector.

In the examples shown in prior art, a phase-skew of one output cycle-, that is 360° phase at the frequency of the output signal-, between the reference signal and the feedback signal 5 corresponds to a charge-pump charge pulse of $I_{CHP}*(1/f_{osc})$. The current injected by the current source that corresponds to this charge pulse is transferred over (or "smeared out" over) the whole signal period of the reference signal $f_{REF}$. As a result, the ratio between the charge pulse current and the current injected by the current source becomes dependent on the divider ratio N within the feedback path of the phase lock loop:

$$I_{CHP}*(1/f_{OSC})=I_{DC}*(1/f_{REF})$$

$$I_{DC}=I_{CHP}*(f_{REF}/f_{OSC})=I_{CHP}/N$$

For a 1-degree phase change, the required injected current becomes $$I_{DC}=I_{CHP}/(N*360) \quad (1)$$

As the output frequency of the oscillator signal is in the range of 20 GHz, while the reference frequency is about 300 MHz, one can assume under normal circumstances a divider ratio N between 50 and 100. If one assumes a divider ratio of N=70, the injected $I_{DC}$ current charge for a 1-degree phase skew becomes about 25000 times smaller than the charge pump current. As the accuracy of current ratios is typically limited by the matching properties, designs of current sources with good matching at such ratios are needed. It is difficult to realize current sources with this enormous ratio while maintaining good matching accuracy, for instance the technique of using unit current sources of equal design would require 25000 units for each current source. Hence, the solutions as stated above will call for a trade-off resulting in either phase control with low accuracy or large chip area. In other words, the current requirement on accuracy of the phase adjustment results in high requirements for current source matching leading to a substantial increase in chip size.

The present solution proposes a different concept, which may have the advantage in reducing the required transistor matching requirements to obtain certain phase accuracy. More particularly, the above and the following solution, the ratio between the charge pump current and the phase control current is much smaller than for the previous solutions.

In an aspect a phase locked loop for a beamforming system comprises a loop filter configured to provide a control signal to a controllable oscillator, said controllable oscillator configured to provide an oscillator signal in response to the control signal. A frequency divider is configured to provide a first feedback signal and a second feedback signal in response to the oscillator signal. The second feedback signal is delayed with respect to the first feedback signal. A first comparator path is configured to receive the first feedback signal and a second comparator path is configured to receive the second feedback signal. Each of the first and second comparator path are configured to provide a respective current signal to the loop filter in response to a respective phase adjustment signal and a phase deviation between a common reference signal and the respective feedback signal.

Generally it is proposed to achieve a phase adjustment by interpolating the phase between two signals generated by a frequency divider. This frequency divider is clocked by the output signal of the Phase locked loop (PLL), and can thus generate accurate output signals with a resolution of one output cycle. In addition to the regular feedback signal a second feedback signal is generated, which may be a replica of the feedback signal but delayed with respect to it. Interpolation is then performed by two charge pumps, each of them receiving a control signal of a phase comparator coupled thereto. The ratio between the currents of the different charge pumps determines their weight in setting the steady state output signal phase.

Despite the advantages stated above, the proposed aspects may consume less chip area, which lead to an easier and cheaper manufacturing process. In addition, the proposed phase locked loop provides a linear relationship between a charge pump current and the resulting phase skew.

In an aspect of the present disclosure each of the first and second comparator paths comprise a phase comparator configured to output a respective control signal in response to the phase deviation; and an adjustable charge pump. The adjustable charge pump is configured to provide the respective current signal to the loop filter in response to the control signal and the respective adjustment signal.

In an aspect, the mentioned delay of the second feedback signal with respect to the first feedback signal is dependent on the frequency or the period of the oscillator signal. For example the delay may be a multiple of the half period of the oscillator signal and in a particular aspect at least a period of the oscillator signal. In an aspect such delay may be adjustable. The proper delay reduces the current matching requirements with respect to previous solution, while also it reduces or prevents non-linearity in the control signal for the oscillator due to cross-over distortion in the comparator paths.

Another aspect is related to signal to the loop filter, wherein a sum of amplitude of the respective current signals of the first and second comparator paths is kept substantially constant. In this regard, the phase locked loop may comprise a current combiner for summing the respective current signal from each of the comparator paths and to provide a summed current signal to the loop filter. As a result, the phase adjustment of the phase locked loop may become proportional to the current signal of the second comparator path, and particularly from the amplitude of said current signal. A constant sum of current amplitudes will also provide constant loop dynamics like bandwidth and settling. Hence, the loop behavior becomes less dependent on phase setting.

In other words, a phase of the oscillator signal is substantially controlled by an amplitude of the current signal of the second comparator path or by a portion of the control signal derived from the current signal of the second comparator path.

In yet another aspect, the phase locked loop comprises an adjustment circuit configured to adjust the ratio of amplitudes of the current signals of the respective adjustable charge pump. This allows setting a reference from which the current signals are derived. In this regard, the adjustment circuit may comprise a phase control input for applying a respective control signal. Such signal can be a digit phase adjustment word. The ratio can generally be represented by a numerator and a denominator. In such representation a denominator of the ratio may correspond to the sum of the amplitudes of the current signals of the respective adjustable charge pump. In an aspect, the adjustment circuit is configured to provide respective adjustment signals to the respective adjustable charge pumps. The adjustment circuit enables the phase locked loop to control the phase of the oscillator output signal.

Other aspects are related to the current source. In an aspect the phase locked loop comprises a plurality of switchable current sources commonly used by or forming a part of the adjustable charge pumps of the first and second comparator paths. In another aspect the frequency divider is an adjustable divider configured to divide the frequency of the oscillator signal based on a frequency divider word.

In another aspect, the phase locked loop is part of a phase locked loop arrangement, comprising at least two phase locked loops and a reference signal source. The reference signal source is configured to provide the reference signal and is also coupled to the first and second comparator path of each of the at least two phase locked loops. A phase deviation module is configured to provide a phase control signal to each of the phase locked loops to generate a phase difference between oscillator signals of the at least two phase locked loops.

With the phase locked loop arrangement the phase relationship between one or more PLL output signals can easily be set and/or adjusted. The phase locked loop arrangement can be used for a beamforming system.

In yet another aspect, the phase locked loop arrangement is implemented in a transmitter, a receiver or more generally a transceiver. For example a transmitter of the above kind comprises the phase locked loop arrangement and an antenna array having a plurality of antenna elements. Each of the antenna elements is in operative connection with a respective one of the phase locked loops of the phase locked loop arrangement to receive an individual signal for transmission derived from the respective oscillator signal thereof. Said individual signal can for example be an up-converted signal or a mixed signal using the respective oscillator signal.

Likewise, an exemplary receiver arrangement comprises a phase locked loop arrangement as disclosed above and an antenna array having a plurality of antenna elements, wherein each of the antenna elements is in operative connection to a respective one of the phase locked loops of the phase locked loop arrangement to down-convert a received signal with the respective oscillator signal thereof.

Another aspect refers to a method. In the method for providing an oscillator signal in a phase locked loop, a common reference signal and an oscillator signal is generated in response to a control signal. First feedback signal based on the oscillator signal and a second feedback signal based on the oscillator signal are generated, wherein the second feedback signal is delayed with respect to the first feedback signal. Based on a comparison between the reference signal and the first feedback signal a first current signal is generated. Likewise a second current signal is generated based on a comparison between the reference signal and the second feedback signal. A current ratio between the first and second current signals is adjusted and the control signal based on the adjusted current ratio of first and second current signals is generated.

Generating the second feedback signal may comprise delaying the first feedback signal depending on the frequency or period of the oscillator signal. Such delay can be an integer multiple of the half-period of the output signal.

In a further aspect, a sum of the amplitude of the first and the second current signals is kept substantially constant. By keeping the sum constant, the phase will become proportional to the second current signal amplitude. In another aspect, adjusting the current ratio comprises adjusting at least one of the amplitudes of the first and second current signals. It may also comprise summing up the amplitudes of the first and second current signals. Further, generating the control signal may comprise combining the first and second current signals and filtering the combined current signals.

FIG. 1 shows an embodiment illustrating one or more aspects of the present disclosure. The phase locked loop 10 is suitable for a beamforming system, in which multiple LO signals having a specific phase shift to each other are generated. The phase locked loop comprises a loop filter 1 configured to provide a control signal FC to a controllable oscillator 2. The controllable oscillator is configured to provide an oscillator signal FO in response to the control signal FC. The controllable oscillator may for example comprise a voltage controlled oscillator and consequently, the loop filter provides a voltage control signal to the oscillator. The loop filter may receive a current signal and may act for example as a low pass filter. In an exemplary embodiment, the loop filter comprises capacitors, resistors and a combination thereof.

A frequency divider 3 is coupled to the output of the oscillator and configured to provide a first feedback signal FB and a second feedback signal FBD in response to the oscillator signal FO. The second feedback signal FBD delayed with respect to the first feedback signal FB. In other words the frequency divider is clocked by the output signal and can thus generate accurate output signals with a resolution of one output cycle of the oscillator signal. In addition to the regular feedback signal FB, the second feedback signal FBD generated can be an exact replica of signal FB but delayed by a number of clock cycles. This delay can be an integer multiple of half clock cycles.

The phase locked loop further comprises a first comparator path 4 and a second comparator path 5. The first comparator path 4 is configured to receive the first feedback signal and the second path 5 is configured to receive the second delayed feedback signal. Each of the first and second comparator paths 4 and 5 is configured to provide a respective current signal CS1, CS2 to the loop filter 1. The current signal is generated in response to a respective adjustment signal FA1, FA2 and a phase deviation between a common reference signal FR and the respective feedback signal FB and FBD.

For this purpose, each comparator path comprises a phase comparator 42, 52, configured to output a respective control signal PFD1 and PFD2 in response to the phase deviation. The phase comparator can be implemented in some aspects as a phase-frequency-detector (PFD). Coupled to an output of each phase comparator 42, 52 is a charge pump 41, 51, receiving the respective control signal PFD1 and PFD2. The charge pumps 41, 51 are adjustable and configured to provide the respective current signal (CS1, CS2) to the loop filter 1 in response to the control signal PFD1, PFD2 and the respective adjustment signal (FA1, FA2).

The two comparator paths improve the accuracy of adjusting the output signal phase of the oscillator by interpolating the two feedback signals generated by the frequency divider. In some aspects, a delay between the delayed feedback signal FBD and the feedback signal FB could be one period of the oscillator output signal FO. Such embodiment would provide the lowest current source matching requirements. However, phase comparators and particular PFD's introduce some non-linearity at close to zero input signal time difference. Hence, an increased delay may be more suitable to avoid the non-linear cross-over situation. For example, delaying the feedback signal by two period cycles of the oscillator signal FO gives a 720 degree range, of which 360 degrees is needed. The rest provides overhead to avoid cross-over non-linearity.

The interpolation of the two feedback signals is performed by the charge pumps 41 and 51, respectively. The amplitude of the current output signal CS1, CS2 from each charge-pump determines its weight in setting the steady-state output signal phase. For instance if all current is provided by one of the charge-pumps it will alone determine the output phase, and if both charge-pumps have the same amplitude in the combined current signal CS=CS1+CS2, the phase will be half-way between the individual ones. Each charge-pump is controlled by a separate PFD. The net current CS will be zero in steady state, i.e. there will be no change over a reference cycle.

Figure 8:
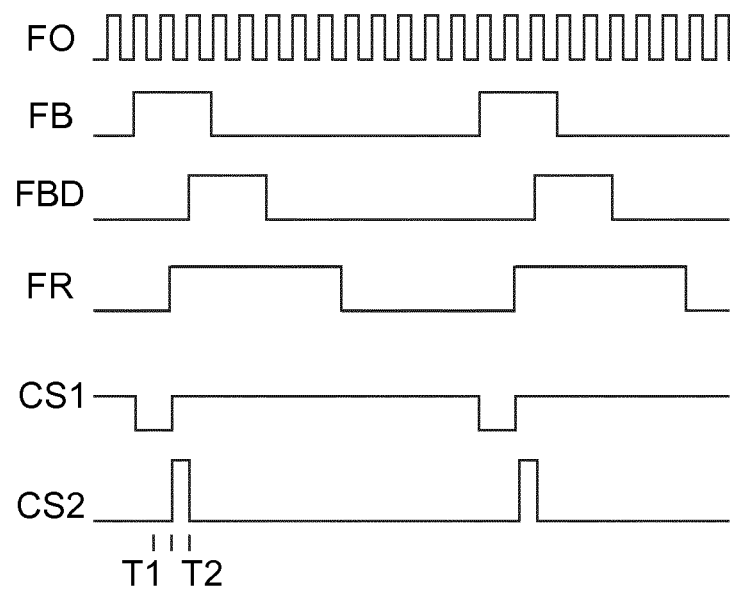
FIG. 8 shows a time diagram for several exemplary signals illustrated in the embodiment of FIG. 1.

FIG. 8 illustrates a non-limiting example of several different signals in accordance with some aspects of the present disclosure. In this example the charge pump current provided in the "on" state by charge pump 51 of second comparator path 5 is two times larger than the charge pump current provided by charge pump 41 of the first comparator path 4. The oscillator output signal FO is applied to the frequency divider, which divides the oscillator signal by a factor 13 (not necessarily maintaining a 50% duty cycle) and outputs the feedback signal FB and a delayed feedback signal FBD. The delayed feedback signal is delayed with respect to the feedback signal FB by two periods of the oscillator output signal FO, or in other words by 720°. The reference signal has its rising edge between a rising edge of the feedback signal FB and a rising edge of the delayed feedback signal FBD. It therefore precedes delayed feedback signal FBD and lags the feedback signal. As a result, during period T1, the first phase comparator 42 provides a phase control signal PFD1 (not shown) to charge pump 41, causing the first charge pump to generate a negative current pulse CS1. During period T2, phase comparator 52 provides a PFD2 signal as to cause charge pump 51 to generate a positive charge pump pulse CS2.

Figure 9:
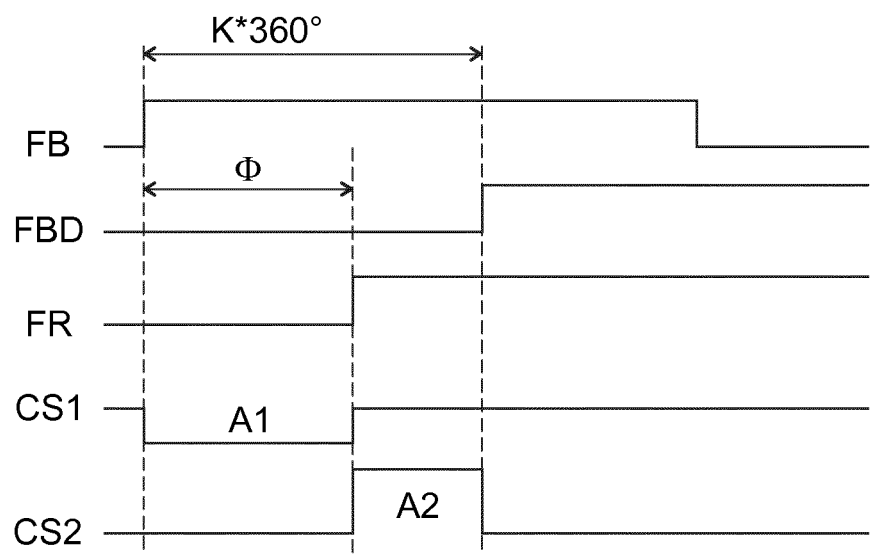
FIG. 9 shows a magnified illustration of the time diagram of FIG. 8.

A close-up of the two charge pump pulses, which in steady-state will have a net area equal to zero, is shown in FIG. 9. Consequently, the oscillator will not change frequency or phase of its output signal. Again delayed feedback signal FBD follows the feedback signal by a fixed delay given by K*360°, wherein K represents half periods of the oscillator's output signal FO. The "delay" between the feedback signal FD and the reference signal FR is set to be the phase φ. The area A1 of current output signal CS1 equals φ*(-$I_{CHP1}$), where $I_{CHP1}$ is the charge pump 1 current. The area A2 of charge pump pulse 2 equals (K*360°-φ)*$I_{CHP2}$, where $I_{CHP2}$ is the charge pump 2 current. Setting the sum of charge pulse areas equal to zero (steady state) gives:

$$|A1| = |A2|$$

$$\phi * (I_{CHP1}) = (K*360° - \phi)*I_{CHP2}$$

$$\phi = K \cdot 360° \cdot \frac{I_{CHP2}}{I_{CHP1} + I_{CHP2}}$$

By keeping the sum of charge pump currents $I_{CHP1}+I_{CHP2}$ substantially constant, the phase φ will become proportional to $I_{CHP2}$. For simplicity, one can assume that the amplitude of the current signals CS1 and CS2 correspond to the respective charge pump currents. The summing or combination of the current signals CS1 and CS2 to provide a combined current signal CS is performed in an optional combiner 7 illustrated in the embodiment of FIG. 1. Since a constant sum of charge pump currents will provide constant loop dynamics like bandwidth or settling, the phase shift or phase skew can easily be introduced by adjusting charge pump current $I_{CHP2}$. A linear phase control can thus be combined with independence of the loop behavior with phase setting.

Due to the interpolation, the frequency division ratio N of the frequency divider is no longer part of the equation above. The phase control is thus independent of N, and N will not affect required matching accuracy in charge pump current sources. Even in case of very high N, the matching requirements can be easy to fulfil. Part of the equation is instead K, the number of periods of the oscillator's output signal FO causing the delay of the delayed feedback signal FBD. Note that the oscillator's output signal's frequency might be multiplied with M to get a new frequency. This multiplication of the oscillator's output signal's frequency results in a multiplication of K, i.e. $K_{mult}$=K*M. If K is a larger number the required accuracy in the ratio between $I_{CHP1}$, and $I_{CHP2}$ is increased. On the other hand, if K is chosen to the minimum, i.e. 1 if M=1, the ends of the 360 degree tuning characteristic may be distorted by phase comparator's non-linearity. If M=1 and full 360 degree range with good linearity is needed, K should thus be larger than 1, but not unnecessarily large as that increases matching requirements. For example K can be chosen as 2 as given in the above example. In a similar way if M is equal to 2, K should be at least 0.5 to cover a complete 360 degree range but could be chosen to be 1 to avoid the risk of distortion as mentioned above. Depending on the ratio M, the K value can have different non-integer values and even become smaller than one. That is due to a multiplication of the operative frequency of the phase locked loop, which also increases the phase tuning range by the same multiplication factor.

Figure 4:
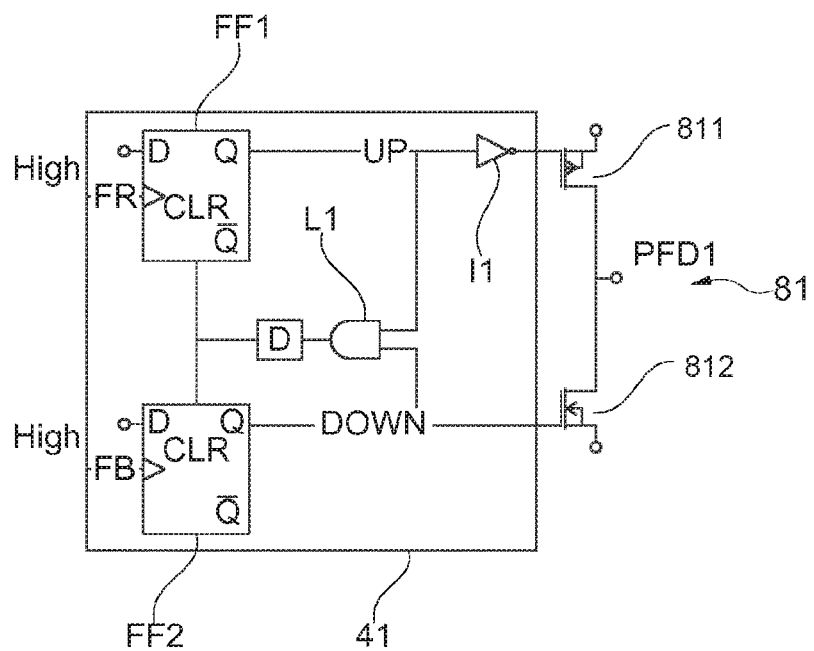
FIG. 4 shows an illustration of a phase detector suitable for an embodiment of the phase locked loop.

An exemplary embodiment of a phase comparator 42 is illustrated in FIG. 4. The phase comparator 52 is of the same type and comprises the same elements. Phase comparator 42 comprises two positive-edge triggered D-Flip-flops FF1 and FF2, wherein their respective signal inputs Dare put to HIGH-state. At the clock inputs of each D-Flip-Flop, the reference signal FR and the feedback signal FB, respectively are applied. Data output Q of flip-flop FF1 is connected to inverter 11 and to an input of a logic AND-gate L1. Output of inverter 11 is connected to a gate of switch 811 of a switch 81 of the charge pump arrangement. Output Q of flip-flop FF2 is connected to the other input of logic gate L1 and to gate of switch 812 of the charge pump arrangement. Both switches 811, 812 are coupled to a common output. Output of logic Gate L1 is coupled via delay element D to the reset inputs CLR of the two flip-flops. When both outputs Q are high, gate L1 will disable the FF1 and FF2 after some delay, causing a reset pulse. Without delay element D, the disablement of flip-flops FF1 and FF2 may cause the outputs Q to a high impedance state, stopping the phase comparator from working by producing neither positive nor negative current pulses. In case of phase or frequency deviation between the reference signals and the feedback signal, one of the flip-flops FF1, FF2 produce a respective longer control signal up or down.

Figure 3A:
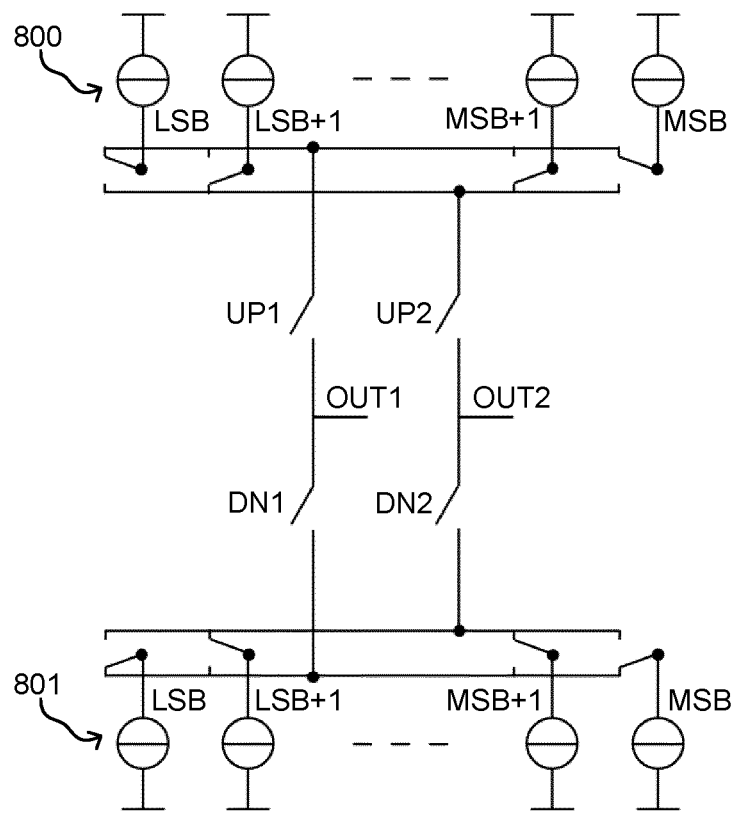
FIG. 3A shows an illustration of current sources being used for an embodiment of the phase locked loop.

FIG. 3A shows an exemplary embodiment of the two charge pumps utilizing common elements. In the example, the two charge pumps may be connected to an arrangement where each current source 800, 801 is switched to one of the charge pumps. Each current source 800, 801 comprises digitally controlled and binary weighted current sources denoted as LSB to MSB. UP1, DN1 corresponds to the first charge pump 41 and UP2, DN2 corresponds to the second charge pump 51) via a switching arrangement. This arrangement has the benefit of ensuring that the sum of charge pump current as described above remains constant. It will also reduce the number of current sources, but may increase the parasitic capacitance of the charge pump slightly. The negative and positive current sources 800 and 801 are matched to provide the same absolute current.

Figure 3B:
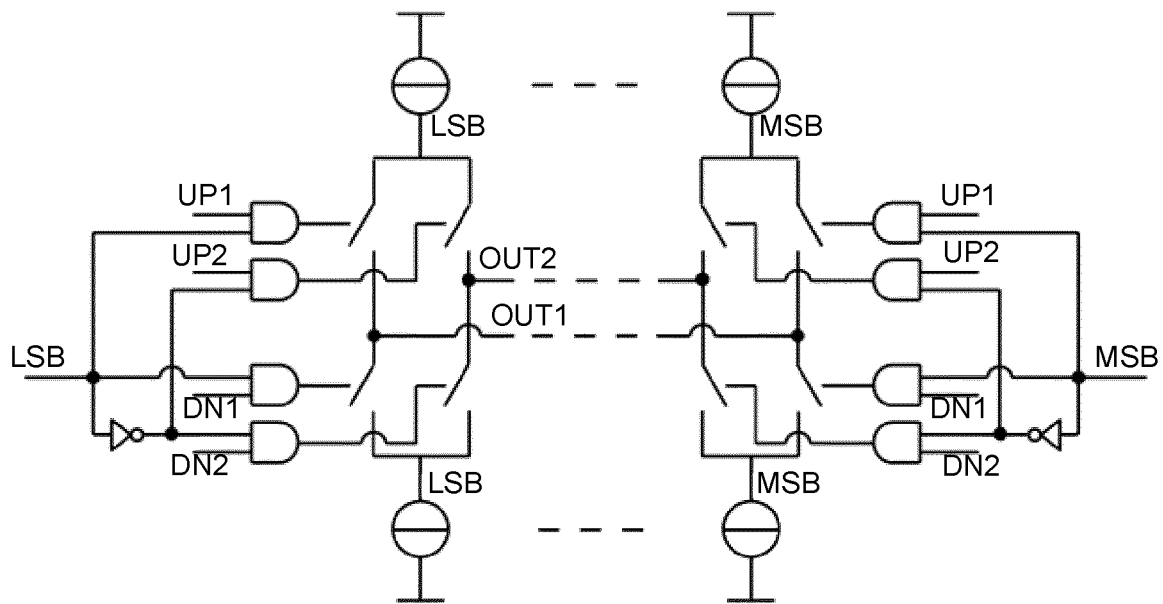
FIG. 3B illustrates a different embodiment of current sources usable in a phase locked loop.

In an alternative embodiment the two charge pumps may be coupled to separate independent programmable current sources 800 and 801. In yet another alternative the pulses from the phase comparators 42 and 52 could be applied to digital current sources as illustrated by an embodiment in FIG. 3B. This alternative is similar to the one displayed in FIG. 3A, the current sources are also binary weighted, denoted as LSB to MSB. However, the series connected switches controlling the current sources noted 800 and 801 in FIG. 3A are avoided by combining the up/down pulses with the current control signals in AND gates. The output signals of the AND gates are controlling the switches of the charge pumps. In FIG. 3A there are two dedicated series connected switches to control the each current source pair, while in FIG. 3B the current control is done in the up/down switches by using AND gates. For example, if LSB is low in FIG. 3B the second charge pump corresponding to switch signals UP2 and DN2 will receive the current from the LSB current source and vice versa if LSB is high.

The digital current control signals LSB to MSB would just enable one output OUT1, OUT2 when receiving the phase control pulses PFD1 (corresponding to UP1, DN1), PFD2 (corresponding to UP2, DN2), so that logically each current source belongs to just one of the charge-pumps at the time.

Figure 2:
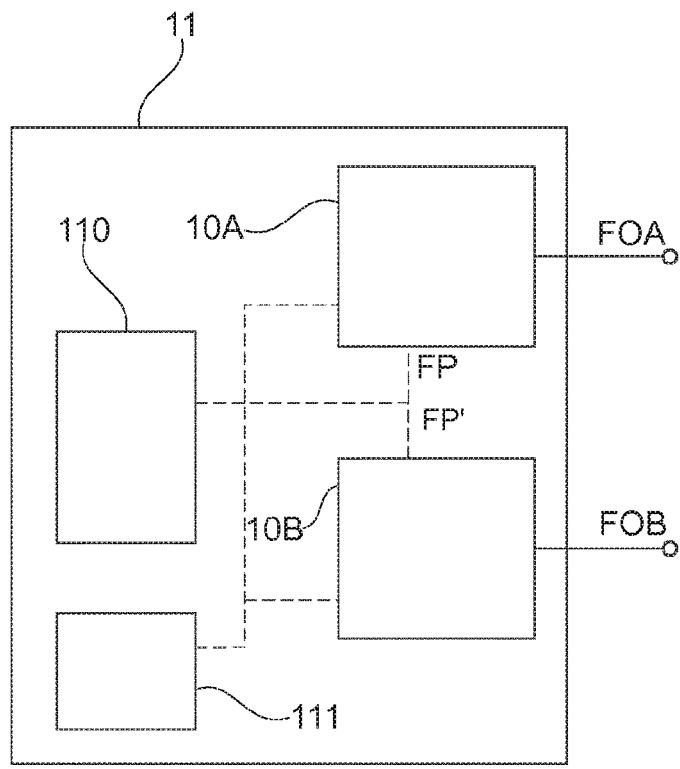
FIG. 2 shows an embodiment of a phase locked loop arrangement particularly for a beamforming system.

The phase locked loop in accordance with several aspects can form a part of a phase locked loop arrangement having more than one phase locked loops. FIG. 2 shows some aspects of such a phase locked loop arrangement 11 for a beamforming system. The arrangement comprises at least two phase locked loops (two of which are shown here) 10A, 10B. The arrangement further comprises a reference signal source 111 providing the reference signal FR. The reference signal source, for example including a temperature stable frequency reference is coupled to the first and second comparator path of each of the phase locked loops 10A and 10B. Further, a phase deviation module 110 is configured to provide a phase control signal FP, FP' to each of the phase locked loops 10A, 10B to generate a phase difference between oscillator signals FOA and FOB of the at least two phase locked loops. The phase control signal FP, FP' can be a digital control word or an analogue signal. The phase control signal FP, FP' is used in the adjustment circuit 6 of the phase locked loop 1 to generate adjustment signal FA1, FA2, which adjust the amplitude of current signals CS1, CS2 provided by the charge pumps during the charge pump pulses.

Figure 5:
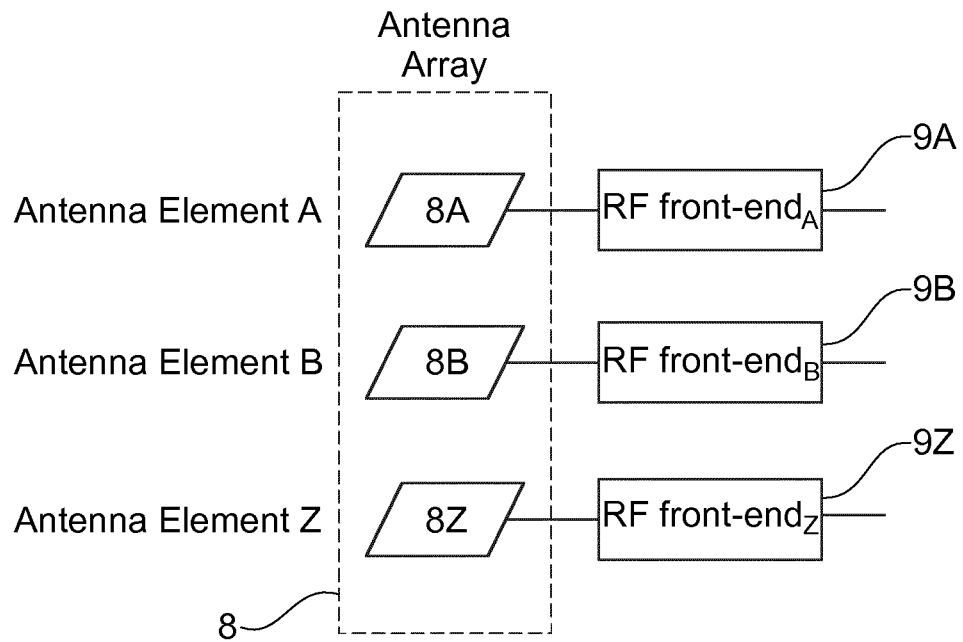
FIG. 5 illustrates a part of a transceiver system in accordance with some aspects of the disclosure.

FIG. 5 illustrates an application of the phase locked loop arrangement in a transceiver device. The term transceiver shall include not only a device able to transmit and receive signals, but also contain a pure transmitter or pure receiver. The transceiver herein is implemented as a beamforming system and comprises an antenna array 8 with a plurality of antenna elements 8A to 8Z. Each of the antenna elements may be located at a different position in space and also point to a different direction. The antenna array may extend over a large area and several elements 8A to 8Z are separated and spaced apart from each other. For example an antenna array may cover an area from a few square centimetres up to several square meters and comprise up to hundreds of individual antenna elements located in that area. In one aspect, the antenna elements are in a fixed position with respect to each other. Each antenna element 8A to 8Z of the antenna array 8 is coupled to a respective RF front-end 9A to 9Z. The RF front-ends are configured to transmit signals to the respective elements, and also receive signals from them. In case of pure transmitter, the RF front-ends are configured only to transmit signals to the respective antenna elements. For pure receiver, the RF front-ends are configured to receive signals therefrom.

Figure 6:
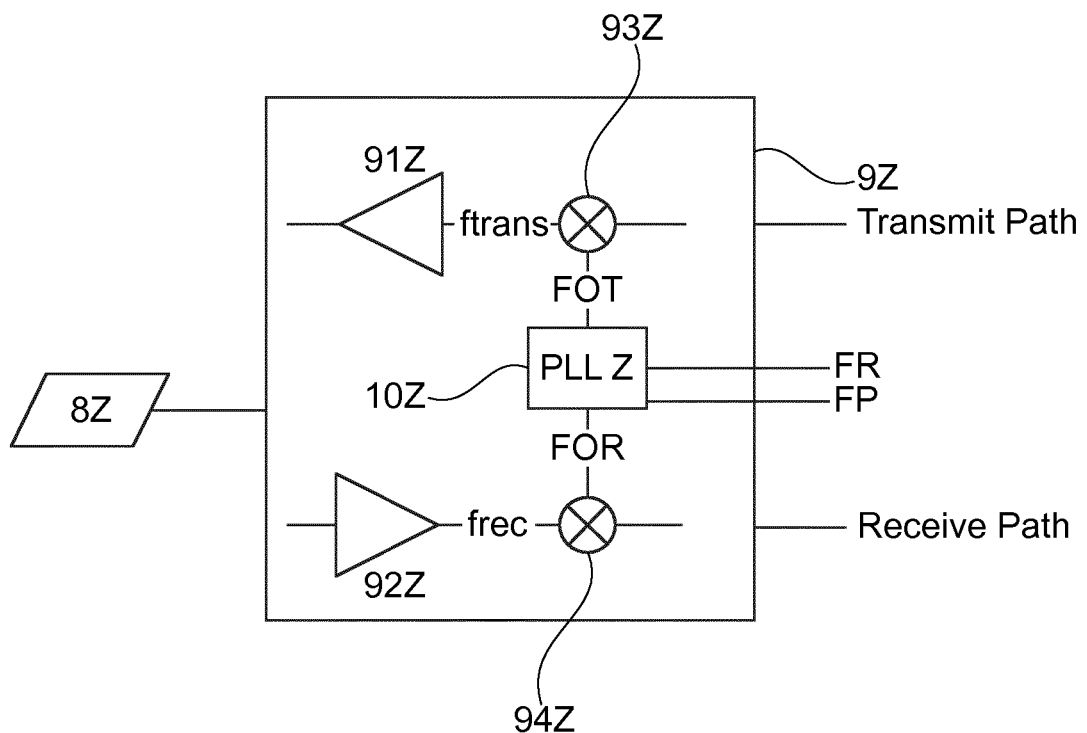
FIG. 6 shows an example of a transceiver element including transmitter and receiver in accordance with some aspect of the present disclosure.

In accordance with aspects of the present disclosure, signals transmitted from the RF front-ends comprise—despite being modulated—different dedicated phase skews. These phase skews result in control of the direction of the signals being transmitted over the antenna array 8. This can be used to increase the signal strength in a receiver for demodulation. Likewise, any signal received via the antenna elements 9A to 9Z is processed in the respective RF front-end using phase shifted LO signals. Signals from a specific direction are constructively amplified or combined, while signals from a different direction not corresponding to the respective phase shifted signal are suppressed. Such processing is further illustrated in FIG. 6 showing an exemplary embodiment of an individual RF front-end 9Z.

Each of the RF front-ends is divided into a transmitter path for a transmission signal ftrans and a reception path for processing a received signal frec. Each path comprises an up-mixing module 93Z and down-mixing module 94Z, respectively. The mixing modules are using a local oscillator signal FOT and FOR provided by a phase locked loop module 10Z. Phase locked loop module 10Z can include one or more phase locked loops to generate a local oscillator signal FOT and FOR, respectively. Phase locked loop module 10Z comprises an input for the reference signal FR and for the phase control signal FP.

In the transmission path, mixing module 93Z is used to frequency up-convert or to modulate the data to be transmitted to the transmission signal ftrans. In this regard, the mixing module 93Z can comprise a conventional mixer, a modulator of some sort, i.e. a quadrature modulator, any combination thereof or any other device using the oscillator signal FOT to generate the transmission signal ftrans therefrom. The transmission signal is then amplified using amplifier module 91Z and fed to antenna element 8Z connected thereto. Likewise a received signal frec is amplified using a low-noise amplification module 92Z and then converted to a lower frequency using the oscillator signal FOR. The phase locked loop module 10Z providing the oscillator signals is part of the phase locked loop arrangement as discussed previously. Accordingly, it comprises a frequency and phase adjustment input to adjust the frequency and phase of the oscillator signals FOT and FOR. The phase locked loop module 10Z may in some cases, like in a frequency division duplex (FDD) system, consist of two separate PLLs generating different frequencies for FOT and FOR.

Figure 7:
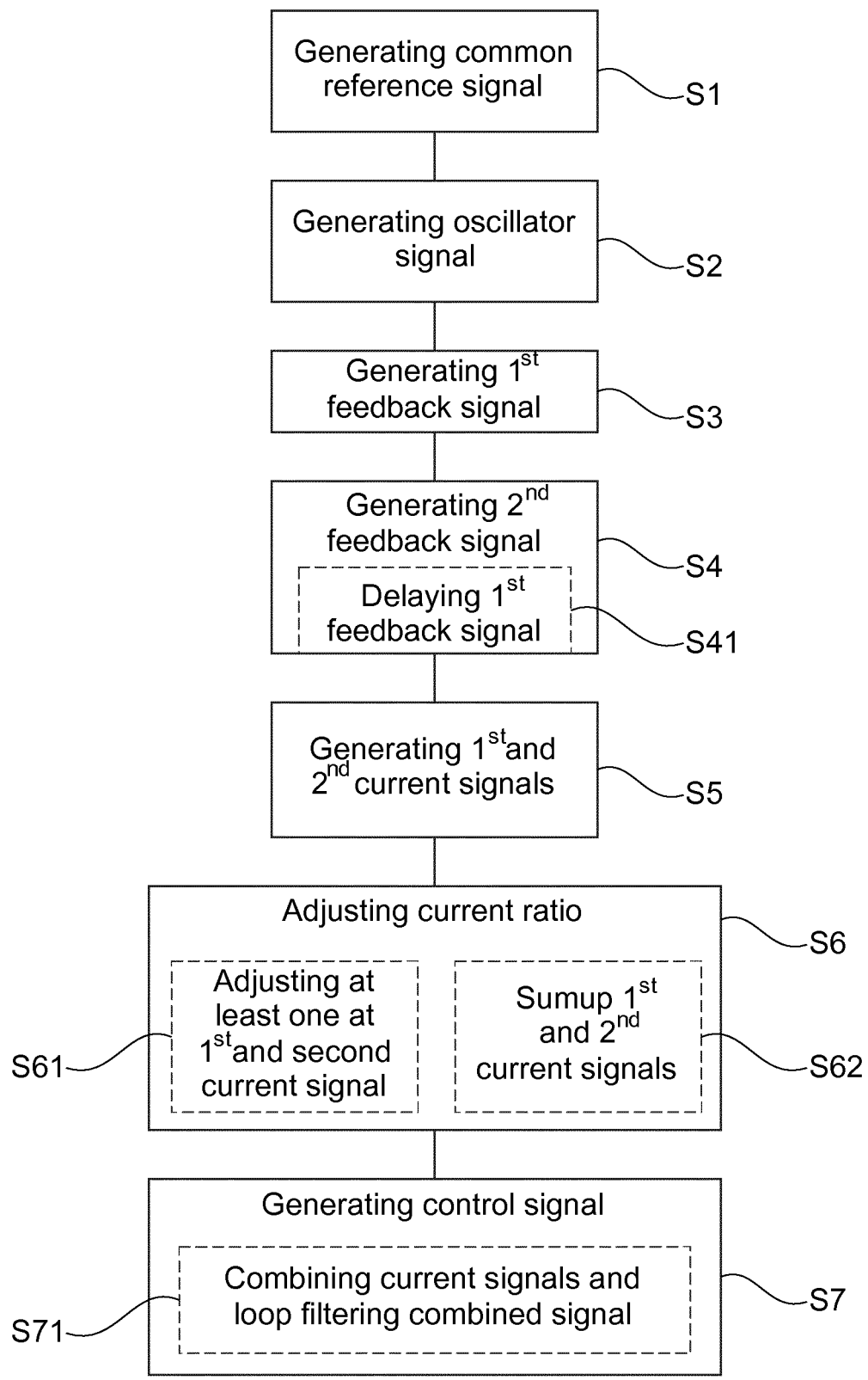
FIG. 7 illustrates aspects of the method for providing an oscillator signal in a phase locked loop.

In yet another aspect, a method for providing an oscillator signal in a phase locked loop is proposed, illustrated in the exemplary method of FIG. 7. The method comprises in its first step S1 to generate a common reference signal FR and in step S2 to generate an oscillator signal (FO) in response to a control signal FC. In a further step S3 a first feedback signal FB based on the oscillator signal FO is generated. Likewise in Step S4, a second feedback signal FBD based on the oscillator signal FO is generated and delayed with respect to the first feedback signal FB.

The generation in steps 53 and 54 can occur at the same time. For example, the oscillator signal is used to simultaneously generate the feedback signals using the same divider ratio and also delay one of the feedback signals with respect to the other one. Alternatively as shown in optional step S41, the first feedback signal FB can be generated. Said first feedback signal is then provided further and also delayed by a certain period to generate the second feedback signal. Such delay can be for example achieved by applying the signal to an inverter chain or to clocked gates (e.g. Flip-Flops) in which its propagation is delayed based on a number of periods of the oscillator signal. In an embodiment, the delay is an integer multiple of the half-period of the output signal.

Then in step S5, a first current signal CS1 based on a comparison between the reference signal FR and the first feedback signal FB is generated. Likewise a second current signal CS2 based on a comparison between the reference signal FR and the second feedback signal FBD is generated. These generations may occur simultaneously, while the current pulses in the respective current signal CS1 and CS2 may follow one another as shown in the examples of FIGS. 8 and 9. A current ratio between the first and second current signals CS1 and CS2 is adjusted in step S6 to control the phase of the oscillator's output signal. Finally, the control signal FC to control the oscillator is generated based on the adjusted current ratio of first and second current signals CS1 and CS2.

In step S6 when adjusting the current ratio it may be suitable in some aspects, to keep the amplitude of the first and the second current signals CS1 and CS2 substantially constant. In such circumstances, a phase of the oscillator signal FO is adjusted by a portion of the control signal FC derived from the second current signal CS2 alone. Consequently, as illustrated in step S61 at least one of the first current signal CS1 and second current signal CS2 is adjusted. Adjusting the current ratio may also comprise in step S62 summing up the first and second current signals CS1 and CS2.

In an aspect the current signals CS1 and CS2 may be adjusted before they are combined in step S71 into a common current signal CS, from which the control signal FC is subsequently derived. Alternatively, ratio adjustment is at least partly done when combining the current signals, for example summing up the amplitudes of the first and second current signal is one way of combining these signals.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims. The terms "phase shift" and "phase skew" shall mean the same for the purpose of this disclosure. The terms "phase comparator", "phase detector" and "phase-frequency" detector shall refer to the same element except otherwise stated.

REFERENCE LIST

1 loop filter
2 controllable oscillator
3 frequency divider
4, 5 phase locked loop
6 adjustment circuit
7 current combiner
10. 10A, 10B phase locked loop
41, 51 charge pump
42, 52 phase comparator
43, 53 output
44, 54 feedback input
45, 55, 55a reference input
63 adjustment input
110 phase deviation module
111 reference signal source
800, 801 current sources
FO oscillator signal
FB feedback signal
FBD delayed feedback signal
CS1, CS2 current signals
CS combined current signal
FA1, FA2 phase adjustment signals
FC control signal
FR reference signal
FP phase difference signal
FOT LO signal transmission
FOR LO signal reception

The invention claimed is:

1. A phase locked loop for a beamforming system, the phase locked loop comprising:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
a first comparator path configured to receive the first feedback signal;
a second comparator path configured to receive the second feedback signal; and
wherein each of the first and second comparator paths are configured to provide a respective current signal to the loop filter in response to a respective phase adjustment signal and a phase deviation between a common reference signal and the respective feedback signal.

2. The phase locked loop of claim 1, wherein each of the first and second comparator paths comprise:
a phase comparator configured to output a respective phase control signal in response to the phase deviation; and
an adjustable charge pump configured to provide the respective current signal to the loop filter in response to the phase control signal and the respective phase adjustment signal.

3. The phase locked loop of claim 2, further comprising an adjustment circuit configured to adjust a ratio of amplitudes of the current signals of the respective adjustable charge pumps.

4. The phase locked loop of claim 3, wherein a denominator of the ratio corresponds to a sum of the amplitudes of the current signals of the respective adjustable charge pumps.

5. The phase locked loop of claim 3, wherein the adjustment circuit is configured to provide respective phase adjustment signals to the respective adjustable charge pumps.

6. The phase locked loop of claim 2, further comprising a plurality of switchable current sources commonly used by or forming a part of the adjustable charge pumps of the first and second comparator paths.

7. The phase locked loop of claim 1, wherein the delay of the second feedback signal with respect to the first feedback signal is dependent on frequency or period of the oscillator signal.

8. The phase locked loop of claim 7, wherein the delay is an integer multiple of a half-period of the oscillator signal.

9. The phase locked loop of claim 1, wherein a sum of an amplitude of the respective current signals of the first and second comparator paths is kept substantially constant.

10. The phase locked loop of claim 1, wherein a phase of the oscillator signal is substantially controlled by an amplitude of the current signal of the second comparator path or by a portion of the control signal derived from the current signal of the second comparator path.

11. The phase locked loop of claim 1, further comprising a current combiner configured to sum the respective current signal from each of the first and second comparator paths and provide a summed current signal to the loop filter.

12. The phase locked loop of claim 1, wherein a frequency divider is an adjustable divider configured to divide the frequency of the oscillator signal based on a frequency divider word.

13. A phase locked loop arrangement for a beamforming system, comprising:
at least two phase locked loops, each phase locked loop comprising:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
a first comparator path configured to receive the first feedback signal;
a second comparator path configured to receive the second feedback signal;
wherein each of the first and second comparator paths are configured to provide a respective current signal to the loop filter in response to a respective phase adjustment signal and a phase deviation between a common reference signal and the respective feedback signal;
a reference signal source providing the reference signal and coupled to the first and second first comparator paths of each of the at least two phase locked loops; and
a phase deviation circuit configured to provide a phase control signal to each of the phase locked loops to generate a phase difference between oscillator signals of the at least two phase locked loops.

14. The phase locked loop arrangement of claim 13, wherein phase control signal is a digital control word.

15. A transmitter arrangement, comprising:
a phase locked loop arrangement comprising:
at least at least two phase locked loops, each phase locked loop comprising:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
a first comparator path configured to receive the first feedback signal;
a second comparator path configured to receive the second feedback signal;
wherein each of the first and second comparator paths are configured to provide a respective current signal to the loop filter in response to a respective phase adjustment signal and a phase deviation between a common reference signal and the respective feedback signal;
a reference signal source providing the reference signal and coupled to the first and second first comparator paths of each of the at least two phase locked loops;
a phase deviation circuit configured to provide a phase control signal to each of the phase locked loops to generate a phase difference between oscillator signals of the at least two phase locked loops; and
an antenna array having a plurality of antenna elements, wherein each of the antenna elements is in operative connection to a respective one of the phase locked loops of the phase locked loop arrangement to receive an individual signal for transmission derived from the respective oscillator signal thereof.

16. A receiver arrangement, comprising:
a phase locked loop arrangement comprising:
at least two phase locked loops, each phase locked loop comprising:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
a first comparator path configured to receive the first feedback signal;
a second comparator path configured to receive the second feedback signal;
wherein each of the first and second comparator paths are configured to provide a respective current signal to the loop filter in response to a respective phase adjustment signal and a phase deviation between a common reference signal and the respective feedback signal;
a reference signal source providing the reference signal and coupled to the first and second first comparator paths of each of the at least two phase locked loops;
a phase deviation circuit configured to provide a phase control signal to each of the phase locked loops to generate a phase difference between oscillator signals of the at least two phase locked loops; and
an antenna array having a plurality of antenna elements, wherein each of the antenna elements is in operative connection to a respective one of the phase locked loops of the phase locked loop arrangement to downconvert a received signal with the respective oscillator signal thereof.

17. A method for providing an oscillator signal in a phase locked loop, comprising:
generating a common reference signal;
generating an oscillator signal in response to a control signal;
generating a first feedback signal based on the oscillator signal;
generating a second feedback signal based on the oscillator signal and delayed with respect to the first feedback signal;
generating a first current signal based on a comparison between the reference signal and the first feedback signal;

generating a second current signal based on a comparison between the reference signal and the second feedback signal;

adjusting a current ratio between the first and second current signals; and generating the control signal based on the adjusted current ratio of first and second current signals.

18. The method of claim 17, wherein the generating the second feedback signal comprises delaying the first feedback signal depending on frequency or period of the oscillator signal.

19. The method of claim 18, wherein the delay is an integer multiple of a half-period of the oscillator signal.

20. The method of claim 17, wherein a sum of amplitudes of the first and second current signals is kept substantially constant.

21. The method of claim 17, wherein a phase of the oscillator signal is adjusted by a portion of the control signal derived from the second current signal.

22. The method of claim 17, wherein the adjusting the current ratio comprises adjusting at least one of amplitudes of the first and second current signals.

23. The method of claim 22, wherein the adjusting the current ratio comprises summing up the amplitudes of the first and second current signals.

24. The method of claim 17, wherein the generating the control signal comprises combining the first and second current signals and filtering the combined current signals.

* * * * *